United States Patent
Marshall et al.

(10) Patent No.: US 7,724,012 B2
(45) Date of Patent: May 25, 2010

(54) CONTACTLESS TESTING OF WAFER CHARACTERISTICS

(75) Inventors: Andrew Marshall, Dallas, TX (US); David Brian Aldrich, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 153 days.

(21) Appl. No.: 11/967,453

(22) Filed: Dec. 31, 2007

(65) Prior Publication Data

US 2009/0167339 A1  Jul. 2, 2009

(51) Int. Cl.
*G01R 31/02* (2006.01)
*G01R 31/26* (2006.01)

(52) U.S. Cl. ...................... 324/763; 324/765

(58) Field of Classification Search ........... None
See application file for complete search history.

(56) References Cited

U.S. PATENT DOCUMENTS

| | | | |
|---|---|---|---|
| 7,112,952 B2 * | 9/2006 | Arai et al. | 324/158.1 |
| 7,256,602 B2 * | 8/2007 | Mattes et al. | 324/765 |
| 2007/0229262 A1 * | 10/2007 | Rofougaran | 340/572.1 |

* cited by examiner

*Primary Examiner*—Paresh Patel
(74) *Attorney, Agent, or Firm*—Yingsheng Tung; Wade J. Brady, III; Frederick J. Telecky, Jr.

(57) ABSTRACT

Systems and methods are provided for contactless testing of a wafer containing at least one integrated circuit. A test component responds to a supply voltage to indicate at least one property of the wafer. A voltage source wirelessly receives power from an external source and produces the supply voltage. A reference generator generates a reference voltage, having a known magnitude, from the supply voltage. A voltage evaluation component modifies the response of the test component as to represent a magnitude of the supply voltage.

20 Claims, 3 Drawing Sheets

CONTACTLESS TESTING OF WAFER CHARACTERISTICS

TECHNICAL FIELD

The present invention relates generally to integrated circuit fabrication, and more particularly to systems and methods for contactless testing of wafer characteristics.

BACKGROUND

Variations among fabrication materials and processes can result in significant variance in the operation of a given integrated circuit design. It is thus frequently cost effective to test the wafers for manufacturing quality control. Unfortunately, that this testing can represent an added opportunity for damage to the relatively delicate structures located on the wafer. To this end, some manufacturers have begun using contactless testing, in which a test structure on the wafer is powered remotely, and the behavior of the test structure is evaluated via remote monitoring of high frequency emissions (e.g., microwave or RF emissions) from the test structure. It will be appreciated, however, that the wireless transmission and monitoring will not generally have the same degree of precision as traditional testing of the wafer.

SUMMARY

In accordance with an aspect of the present invention, a contactless on-wafer testing system is provided. A test component responds to a supply voltage to indicate at least one property of the wafer. A voltage source wirelessly receives power from an external source and produces the supply voltage. A reference generator generates a reference voltage, having a known magnitude, from the supply voltage. A voltage evaluation component modifies the response of the test component as to represent a magnitude of the supply voltage.

In accordance with another aspect of the present invention, a method is provided for testing a wafer comprising at least one integrated circuit. A supply voltage is generated at a test circuit. A reference voltage is generated from the supply voltage. A ramping signal is produced that varies in substantially even increments from zero voltage to the supply voltage over a given period. A test component is selectively powered with the supply voltage, such that the test component is powered only when the ramping voltage exceeds the reference voltage. A value for the supply voltage is determined from an associated duty cycle of the test component and the reference voltage.

In accordance with yet another aspect of the present invention, a testing apparatus for an integrated circuit fabrication process is provided. A contactless test system includes a transmitter that transmits a first signal, a receiver that receives a signal from a test assembly located on an associated wafer, and a system control that determines at least one parameter characterizing the wafer from the received signal. The test assembly includes a test component that responds to a supply voltage to provide the signal received by the receiver, and a voltage source that converts the signal transmitted from the transmitter into the supply voltage. A reference generator generates a reference voltage, having a known magnitude, from the supply voltage. A voltage evaluation component modifies the response of the test component as to represent a magnitude of the supply voltage, such that the system control is operative to determine the magnitude of the supply voltage from the received signal.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

Figure 1:
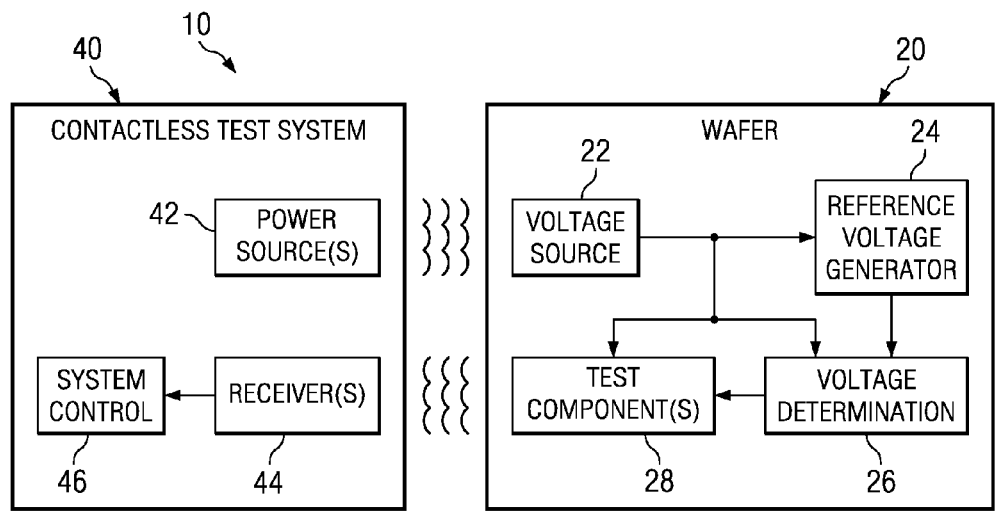
FIG. 1 illustrates a wafer testing arrangement in accordance with an aspect of the present invention.

FIG. 1 illustrates a wafer testing arrangement 10 in accordance with an aspect of the present invention. A testing assembly on a wafer 20 includes a voltage source 22 that receives power wirelessly, for example, via a radio frequency (RF) signal or via electromagnetic radiation, and provides a supply voltage for the testing assembly. For example, the voltage source 22 can be implemented as a set of one or more inductor coils or a set of one or more photodetectors. The supply voltage produced at the voltage source 22 is provided to a reference voltage generator 24 that provides a known, supply-independent, reference voltage from the supply voltage. In one implementation, the reference voltage generator 24 includes a bandgap circuit.

The reference voltage and the supply voltage are provided to a voltage evaluation component 26. The voltage evaluation component 26 regulates the voltage supplied to one or more test components 28 as to manipulate at least one parameter associated with the one or more test components such that the manipulated parameter varies with the supply voltage. In one implementation, the voltage evaluation component 26 selectively powers at least one of the one or more test components according to the relative magnitudes of the supply voltage and the reference voltage, such that the manipulated parameter includes a duty cycle of the at least one test component.

The wafer testing arrangement 10 further comprises a contactless test system 40 that wirelessly powers the testing assembly on the wafer 20 and evaluates the behavior of the one or more test components 28. One or more power sources 42 provide power to the voltage source across a gap between the test system 40 and the wafer 20. In one implementation, the one or more power sources 42 can include a plate or coil that can be energized to produce a radio frequency signal. In another implementation, the one or more power sources 42 can include a laser that produces a light beam in the infrared, visible, or ultraviolet regions of the electromagnetic spectrum.

One or more receivers 44 remotely monitor the test components and record at least one characteristic of the test components. For example, the one or more receivers 44 can be configured to receive a signal from the test component via, for example, capacitive or inductive coupling. In one implementation, the one or more receivers can comprise antenna coil structures with an appropriate tuned low pass filter and a low noise amplifier to capture radio frequency energy emitted by the one or more test structures. The captured signal is provided to a system control 46 that analyzes the signal to determine one or more characteristics of the wafer and its associated integrated circuits. In accordance with an aspect of the present invention, the system control 46 can also quantify the supply voltage provided by the voltage source 22 as well as one or more voltages at other points in the testing assembly. For example, the length of associated duty cycles of one or more duty cycles can be evaluated to determine the magnitude of the supply voltage and the magnitude of a voltage across a device under test.

Figure 2:
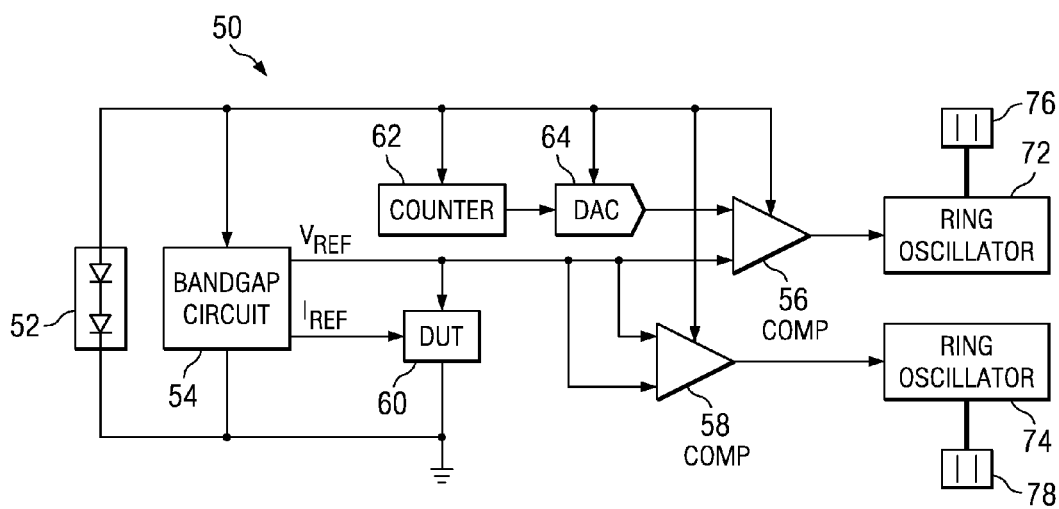
FIG. 2 illustrates one implementation of a wafer testing arrangement in accordance with an aspect of the present invention.

FIG. 2 illustrates one implementation of a wafer testing arrangement 50 in accordance with an aspect of the present invention. The illustrated wafer testing arrangement 50 includes a bank of photodiodes 52 that convert a beam of light, for example, light in the infrared, visible, or ultraviolet regions of the electromagnetic spectrum, into a supply voltage, $V_s$, for the testing arrangement. In the illustrated example, two photodiodes are used to provide the supply voltage, but it will be appreciated that the bank of photodiodes 52 can comprise one photodiode or more than two photodiodes. The voltage produced by the bank of photodiodes 52 is provided to a bandgap circuit 54, which provides a supply-independent reference voltage, $V_R$, and a supply-independent reference current $I_R$. The reference voltage is provided to a first comparator 56 as a first input. The reference current can be provided to one or more devices under test (DUT) 58 as a direct current (DC) source to facilitate additional testing on the circuit. For example, the devices under test 58 can include a transistor fabricated on the wafer. The voltage across the device under test 58 can be provided to a second comparator 60 as a first input.

A counter 62 provides a count that increments from a minimum value (e.g., zero) to a maximum value over a given period. In one implementation, the counter 62 can be implemented as a non-precision counter. The output of the counter 62 is converted into an analog signal at a digital-to-analog converter 64, powered by the supply voltage, to produce a ramping signal that varies from zero to the supply voltage in substantially even increments. This ramping signal is provided to the set of comparators 56 and 58 as a second input. The comparators 56 and 60 are configured to provide the supply voltage to respective ring oscillators 72 and 74 only when the ramping signal exceeds the threshold voltage. Accordingly, the first ring oscillator 72 will resonate only during the time in each period of the counter 62 when the ramping voltage exceeds the reference voltage, and the second ring oscillator will resonate only during the time in each period when the ramping voltage exceeds the voltage across the device under test 58. The magnitude of the each voltage relative to the reference voltage can be determined from the duty cycles of their respective ring oscillator 72 and 74. Since the duty cycle of a given ring oscillator (e.g., 72) can be measured fairly readily, for example, via capacitive coupling with an external probe at respective capacitor pads 76 and 78, this allows the magnitude of the supply voltage and the voltage across the device under test 58 to be determined with some precision.

Figure 3:
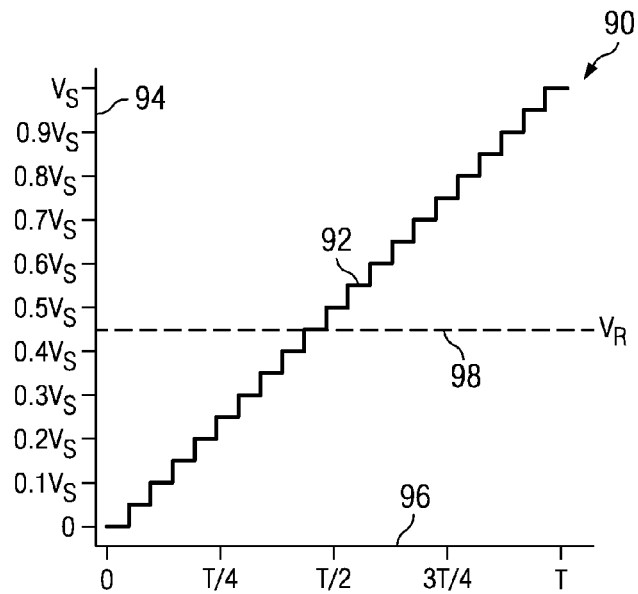
FIG. 3 is a chart of a simplified example of an exemplary ramping signal that can be produced by an exemplary counter and digital-to-analog converter arrangement.

FIG. 3 is a chart 90 of a simplified example of an exemplary ramping signal 92 that can be produced by the counter 62 and digital-to-analog converter 64 illustrated in FIG. 2. A vertical axis 94 represents a voltage associated with the signal, in fractions of the supply voltage, $V_s$. A horizontal axis 96 indicates the passage of time in fractions of a clock period, T, of the counter 62. An exemplary reference voltage, $V_R$, is indicated on the chart as a dotted horizontal line 98. In accordance with an aspect of the present invention, a test component can be configured to operate only when the ramping signal 92 exceeds the threshold voltage. Accordingly, the magnitude of the supply voltage can be determined according to the percentage of time the test circuit is active.

Figure 4:
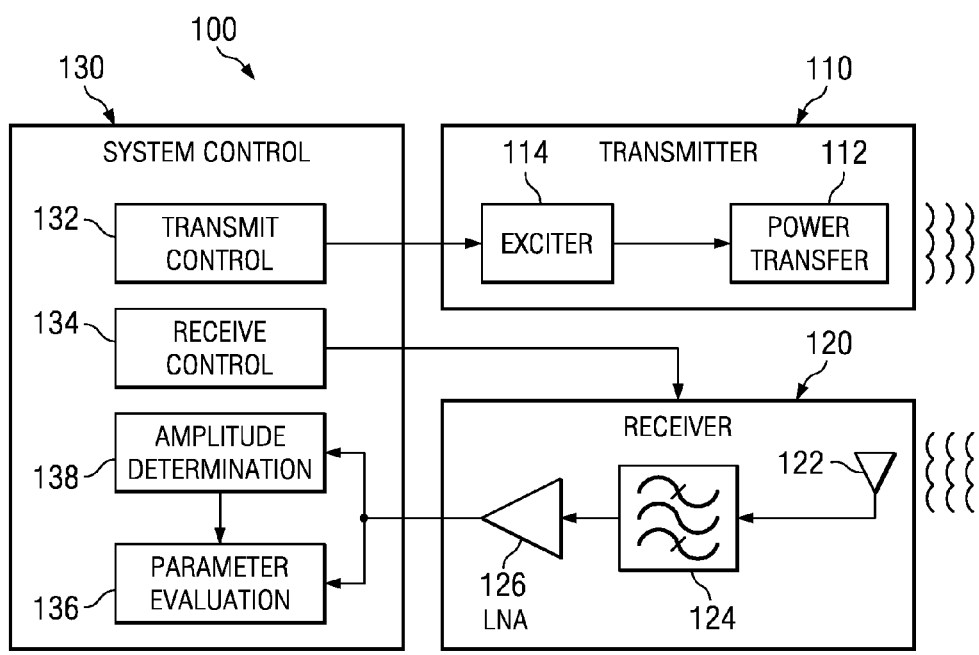
FIG. 4 illustrates an exemplary implementation of a contactless test system in accordance with an aspect of the present invention.

FIG. 4 illustrates an exemplary implementation of a contactless test system 100 in accordance with an aspect of the present invention. In the simplified functional block diagram of FIG. 4, the contactless test system 100 can be conceptualized as three distinct subsystems, including a transmitter 110 that is configured to wirelessly provide power to a test circuit on a wafer (not shown), a receiver apparatus 120 that measures one or more parameters of a test structure on the test circuit, and a system control 130 that is operative to adjust the operation of the transmitter 110 and the receiver apparatus 120 as well as evaluate signals received at the receiver apparatus. It will be appreciated that each of these subsystems 110, 120, and 130 can be implemented as dedicated hardware, software comprising executable instructions on a computer readable medium that are executed by a general purpose processor, or some combination thereof.

The transmitter 110 comprises a power transfer component 112 that is configured to wirelessly provide power to the test circuit. For example, the power transfer component 112 can comprise an antenna coil that generates a radio frequency (RF) signal or a laser that directs a beam of light (e.g., infrared, visible, or ultraviolet light) toward the test circuit. An exciter 114 is operative to produce a signal, in a form appropriate to the power transmitter 112, for transmission. For example, the signal could provide a pulsed transmission to the test circuit. The exciter 114 and the provided signal can be altered, for example, in response to input from a user, at a transmitter control 132 in the system control 130.

The receiver assembly 120 comprises an antenna component 122 that receives a signal from the test circuit. For example, the antenna component 122 can comprise one or more coils that receive a signal from the test circuit via induction or a conductive plate that receives a signal from the test circuit via capacitive coupling. The received signal is filtered at a bandpass filter 124 and amplified at a low noise amplifier 126. The amplified signal is then provided to the system control 130 for analysis. The receiver assembly 120 can be configured, for example, in response to input from a user, at a receiver control 134 in the system control. For example, the bandpass filter 124 can have a tunable bandpass that is alterable by the receiver control 134.

A parameter evaluation component 136 in the system control 130 evaluates the signal from the receiver assembly 120 to determine at least one parameter associated with the test circuit. For example, the parameter evaluation component 136 can comprise a spectrum analyzer that determines one or more of the frequency, phase noise, and harmonic content of the signal and one or more performance parameters of the test circuit can be determined from these values. In one implementation, the test circuit includes a ring oscillator, and the detected frequency of oscillation of the ring oscillator can be used to determine delay characteristics of the test circuit and other circuits on the wafer.

An amplitude determination component 138 can determine a supply voltage provided to the test circuit from the signal received at the receiver assembly 120. A test circuit configured in accordance with an aspect of the present invention, for example, the test circuit illustrated in FIG. 2, can operate such that the provided signal provides an indication of the voltage supplied by the power transfer component 112. For example, a duty cycle of a test component associated with the test circuit can be controlled to indicate the magnitude of the supplied voltage relative to a known reference voltage. The amplitude determination component 138 can derive a value for the supply voltage from the received signal and provided the derived supply voltage to the parameter evaluation component 136 to increase the precision of the determined performance parameters. A voltage across a device under test provided with a known reference current can be determined in a similar manner using one or more additional test circuits.

Figure 5:
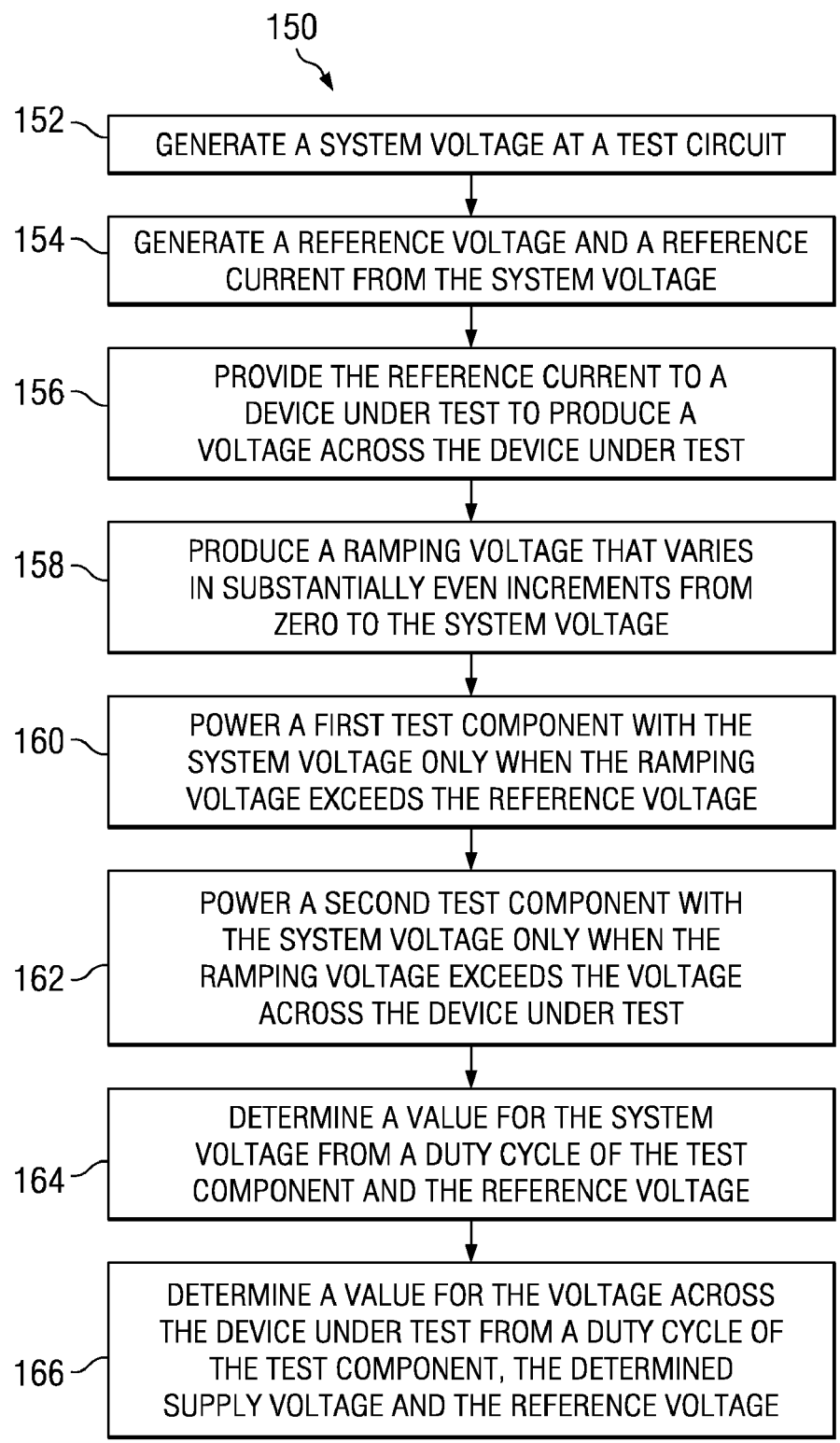
FIG. 5 illustrates a methodology for testing at least one characteristic of an integrated circuit in accordance with an aspect of the present invention.

In view of the foregoing structural and functional features described above, a methodology in accordance with various aspects of the present invention will be better appreciated with reference to FIG. 5. While, for purposes of simplicity of explanation, the methodology of FIG. 5 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 5 illustrates a methodology 150 for testing at least one characteristic of an integrated circuit in accordance with an aspect of the present invention. At 152, a supply voltage is generated at a test circuit. For example, a radio frequency (RF) signal can be provided from a contactless test system to induce a voltage at the test circuit. Alternatively, a laser can be used to generate a voltage at a set of photodiodes at the test circuit. At 154, a reference voltage and a reference current are generated from the supply voltage. In one implementation, a bandgap circuit is used to generate the reference voltage and the reference voltage. At 156, the reference current is provided to a device under test to produce a voltage across the device under test.

At 158, a ramping signal is produced that varies in substantially even increments from zero voltage to the supply voltage over a given period. At 160, a first test component is selectively powered with the supply voltage, such that the first test component is powered only when the ramping voltage exceeds the reference voltage. At 162, a second test component is selectively powered with the supply voltage, such that the second test component is powered only when the ramping voltage exceeds the voltage across the device under test. Accordingly, a periodic duty cycle of each test component is established, such that the percentage of time the test component is active is a function of the voltage associated with the test component. At 164, a value is determined for the supply voltage from an associated duty cycle of the test component and the reference voltage. This can be determined, for example, as the magnitude of the reference voltage divided by the percentage of time the test component is inactive. At 166, a value can be determined for the voltage across the device under test in a similar manner from an associated duty cycle of the test component, the determined supply voltage, and the reference voltage.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A contactless on-wafer testing system for a wafer comprising at least one integrated circuit comprising:
 a test component that responds to a supply voltage to indicate at least one property of the wafer;
 a voltage source that wirelessly receives power from an external source and produces the supply voltage;
 a reference generator that generates a reference voltage, having a known magnitude, from the supply voltage; and
 a voltage evaluation component that modifies the response of the test component as to represent a magnitude of the supply voltage.

2. The system of claim 1, the voltage evaluation component comprising at least one comparator that selectively powers the component with the supply voltage.

3. The system of claim 2, the voltage evaluation component comprising a counter that increments from zero to a maximum value over a given period, and an digital-to-analog converter that converts an output of the counter to a ramping signal that varies in substantially even increments from zero voltage to the supply voltage over the given period.

4. The system of claim 3, the at least one comparator receiving the ramping signal as a first input and the reference voltage as a second input such that the at least one test component is powered only when a voltage of the ramping signal exceeds the reference voltage.

5. The system of claim 1, the voltage source comprising at least one inductor coil.

6. The system of claim 1, the voltage source comprising at least one photodiode.

7. The system of claim 1, further comprising at least one device under test, the reference generator providing a known reference current to the device under test to produce a voltage across the device under test.

8. The system of claim 7, further comprising a second test component, the voltage evaluation component comprising at least one comparator that selectively powers the second test component with the supply voltage as to modify the response of the second test component as to represent a magnitude of the voltage across the device under test.

9. The system of claim 1, the test component comprising a ring oscillator that oscillates in response to the supply voltage with a characteristic frequency, the characteristic frequency being indicative of at least one property of the wafer.

10. The system of claim 1, the voltage evaluation component being configured to selectively provide the supply voltage to the ring oscillator according to a comparison of the reference voltage and the supply voltage such that a duration of oscillation of the ring oscillator can be used to determine the magnitude of the supply voltage.

11. A method for testing a wafer comprising at least one integrated circuit, comprising:
 generating a supply voltage at a test circuit;
 generating a reference voltage from the supply voltage;
 producing a ramping signal that varies in substantially even increments from zero voltage to the supply voltage over a given period;
 selectively powering a test component with the supply voltage, such that the test component is powered only when the ramping voltage exceeds the reference voltage; and
 determining a value for the supply voltage from an associated duty cycle of the test component and the reference voltage.

12. The method of claim 11, wherein generating a supply voltage at a test circuit comprises wirelessly transmitting power from a test system to a voltage source on the test circuit.

13. The method of claim 11, wherein producing a ramping signal comprises incrementing a counter over the given period and converting the counter output into an analog signal at a digital to analog converter.

14. The method of claim 11, further comprising:
 generating a reference current from the supply voltage;
 providing the reference current to a device under test to produce a voltage across the device under test; and selectively powering a second test component with the supply voltage, such that the second test component is powered only when the ramping voltage exceeds the voltage across the device under test; and determining a value for the supply voltage from an associated duty cycle of the second test component, the determined value for the supply voltage and the reference voltage.

15. A testing apparatus for an integrated circuit fabrication process, comprising:

a contactless test system comprising:
   a transmitter that transmits a first signal;
   a receiver that receives a signal from a test assembly located on an associated wafer; and
   a system control that determines at least one parameter characterizing the wafer from the received signal; and the test assembly, comprising:
   a test component that responds to a supply voltage to provide the signal received by the receiver;
   a voltage source that converts the signal transmitted from the transmitter into the supply voltage;
   a reference generator that generates a reference voltage, having a known magnitude, from the supply voltage; and
   a voltage evaluation component that modifies the response of the test component as to represent a magnitude of the supply voltage, such that the system control is operative to determine the magnitude of the supply voltage from the received signal.

16. The apparatus of claim 15, the transmitter comprising a laser and the voltage source comprising at least one photodiode.

17. The apparatus of claim 15, the voltage evaluation component being configured to selectively provide the supply voltage to the test component according to a comparison of the reference voltage and the supply voltage such that the system control can use a duration of operation of the ring oscillator to determine the magnitude of the supply voltage.

18. The apparatus of claim 15, the test assembly further comprising at least one device under test, the reference generator providing a known reference current to the device under test.

19. The apparatus of claim 15, the reference generator comprising a bandgap circuit.

20. The apparatus of claim 15, the voltage evaluation component comprising a counter that increments from zero to a maximum value over a given period, and an digital-to-analog converter that converts an output of the counter to a ramping signal that varies in substantially even increments from zero voltage to the supply voltage over the given period.

* * * * *